(12) United States Patent
Randlett

(10) Patent No.: US 7,411,460 B2
(45) Date of Patent: Aug. 12, 2008

(54) ELIMINATION OF DUMMY DETECTOR ON OPTICAL DETECTORS USING INPUT COMMON MODE FEEDBACK

(75) Inventor: Richard W. Randlett, Palo Alto, CA (US)

(73) Assignee: Exar Corporation, Fremont, CA (US)

( * ) Notice: Subject to any disclaimer, the term of this patent is extended or adjusted under 35 U.S.C. 154(b) by 51 days.

(21) Appl. No.: 11/372,793

(22) Filed: Mar. 10, 2006

(65) Prior Publication Data
US 2007/0210872 A1    Sep. 13, 2007

(51) Int. Cl.
*H03F 3/08*   (2006.01)

(52) U.S. Cl. ..................................... 330/308
(58) Field of Classification Search ............... 330/308; 250/214 A
See application file for complete search history.

(56) References Cited

U.S. PATENT DOCUMENTS

| 7,193,478 | B2 * | 3/2007 | Filip | 330/308 |
| 2005/0046482 | A1 * | 3/2005 | Schrodinger | 330/308 |

* cited by examiner

*Primary Examiner*—Steven J Mottola
(74) *Attorney, Agent, or Firm*—Fliesler Meyer LLP

(57) ABSTRACT

A voltage reference forces a constant voltage at the inputs to an amplifier, thereby negating a need for a dummy detector on the non-active input of the amplifier.

17 Claims, 2 Drawing Sheets

ELIMINATION OF DUMMY DETECTOR ON OPTICAL DETECTORS USING INPUT COMMON MODE FEEDBACK

COPYRIGHT NOTICE

A portion of the disclosure of this patent document contains material that is subject to copyright protection. The copyright owner has no objection to the facsimile reproduction by anyone of the patent document or the patent disclosure, as it appears in the U.S. Patent and Trademark Office patent file or records, but otherwise reserves all copyright rights whatsoever.

FIELD OF THE INVENTION

The invention relates generally to electrical signal amplifier circuits, and more particularly to electrical signal amplifier circuits with photo-detectors.

BACKGROUND

Electrical signal amplifier circuits with photo-detectors, such as photodiodes, can be used for a number of applications such as in digital versatile disc (DVD) players, and in compact disc (CD) players, and for many other applications. Conventionally, a dummy detector may be employed in order to achieve AC balance of the amplifier (equal input capacitance on both sides). Substitution of the capacitance of the dummy detector by a lumped capacitor of equal value does not work. Dummy detectors, however, take up significant portions of the die. Accordingly, mechanisms for eliminating the dummy detector from the amplifier circuit are sought.

BRIEF DESCRIPTION OF THE DRAWINGS

Preferred embodiment(s) of the present invention will be described in detail based on the following figures, wherein.

DETAILED DESCRIPTION

Figure 1:
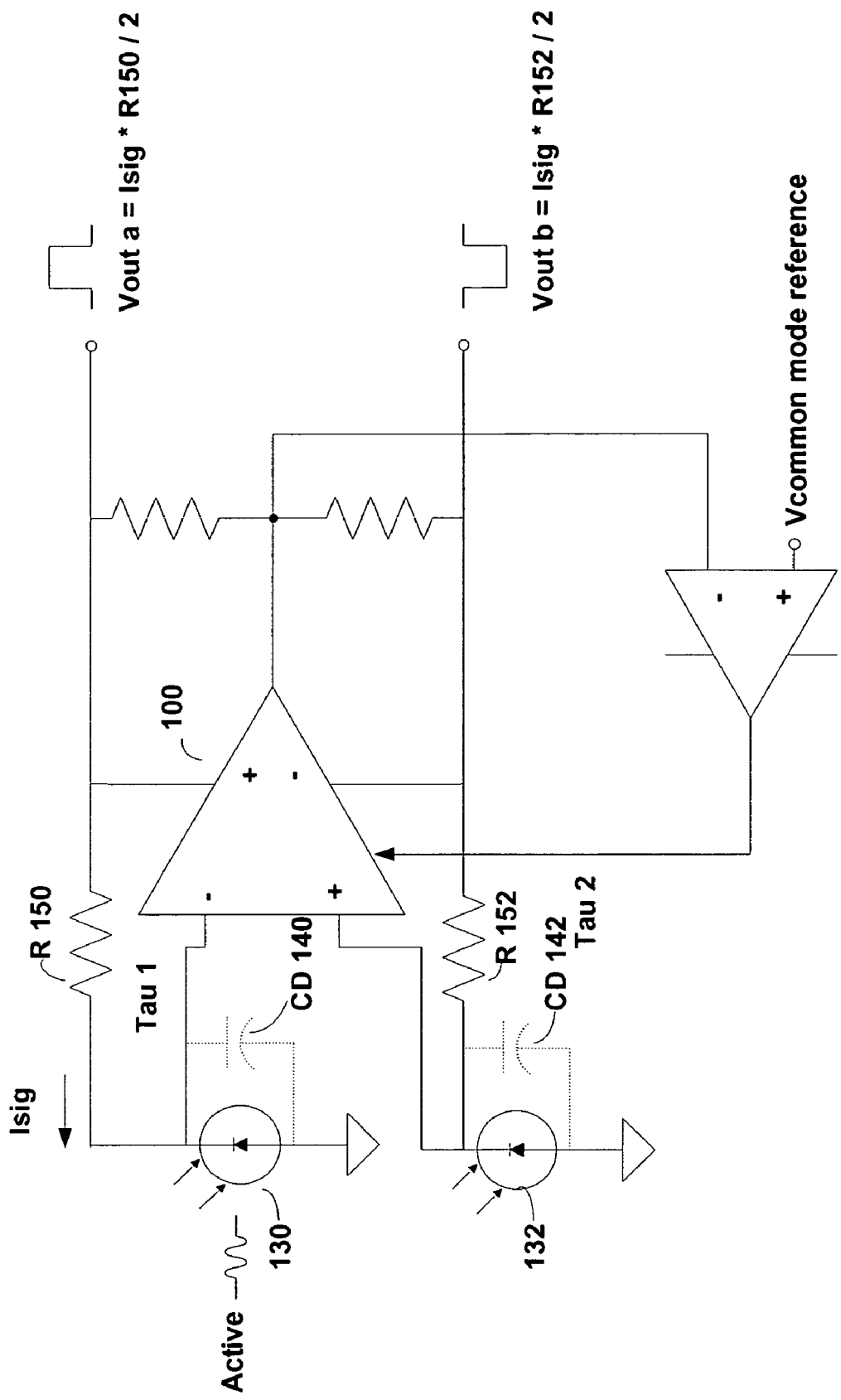
FIG. 1 is an example of an amplifier circuit.

FIG. 1 shows an amplifier circuit 100, in which output common mode feedback is employed to set the output common mode voltage. The amplifier 100 can include feedback resistors R 150 and R 152. In operation, when an input signal current Isig is injected on the active side of the amplifier circuit by application of a stimulus to photo-detector 130, an output, Vout appears as a balanced differential signal, Vout a and Vout b. This configuration relies upon an input common mode shift equal to ½ the peak-to-peak amplitude of the output signal Vout. Accordingly, this may be achieved by making the two time constants, Tau 1 and Tau 2, equal. As indicated by FIG. 1, time constant Tau 1 is a characteristic of an RC circuit comprising of resistor R 150 and diode capacitance CD 140. Diode capacitance CD 140 is illustrated with a dotted line in FIG. 1 because this capacitance is a property of a photo diode comprising photo-detector 130. Analogously, time constant Tau 2 is a characteristic of the RC circuit formed by resistor R 152 and diode capacitance CD 142 arising from the photo diode comprising photo-detector 132.

Several problems and performance limitations are associated with the architecture shown in FIG. 1. In order to minimize offset and offset drift in photo-detector transimpedance amplifiers, a differential-in, differential-out amplifier configuration is normally employed as shown by FIG. 1. Conventionally, a dummy detector, i.e. photo-detector 132 of FIG. 1, is employed in order to achieve AC balance of the amplifier (equal input capacitance on both sides). Substitution of the capacitance of the dummy detector by a lumped capacitor of equal value does not work. Better than 2% matching between capacitors over temperature would be required. This may not be achievable due to process differences in the implementation of the photodetectors and lumped capacitors. A mismatch in capacitance reflects as a differential mismatch in bandwidth and results in the creation of a "long tail" in the pulse response of the amplifier. In automatic power control (APC) circuits, for example, the photo-detector area is quite large, often representing up to 50% of the total circuit area when the dummy detector is included. Elimination of the dummy detector would result in a considerable reduction in die area and resulting cost of the architecture of FIG. 1.

Figure 2:
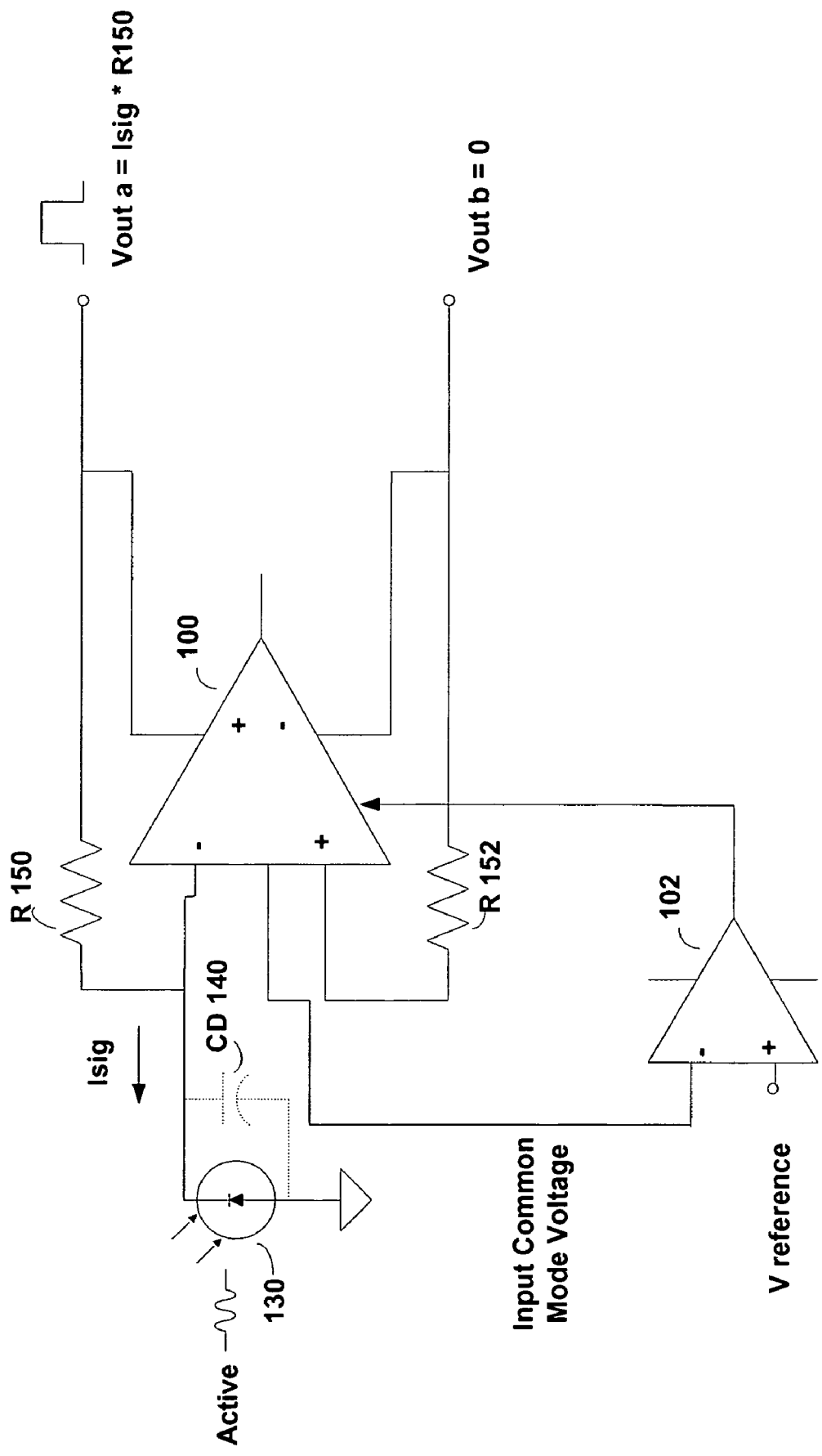
FIG. 2 is an improved amplifier circuit of one embodiment.

In one embodiment shown in FIG. 2, a second amplifier 102 is coupled to the amplifier 100 in order to force a constant voltage at the inputs of amplifier 100. The second amplifier 102 can achieve this by sensing the input common mode voltage at amplifier 100, determining an output signal from the input voltage of amplifier 100 and a reference voltage, V reference, and providing the output signal to the amplifier 100 in order to force a constant voltage at the inputs of amplifier 100. The operation of amplifier 102 can negate the need for a dummy detector, i.e., photo-detector 132 of FIG. 1, on the non-active side of the amplifier 100 of FIG. 2.

In embodiments, the output of the first amplifier is used in a laser-based device. Laser-based devices can include without limitation a compact disc (CD) drive and a digital versatile disc (DVD) drive and others.

According to one set of embodiments, the signal now appears single-ended on the active side of the circuit, but the DC stability with regard to offset and offset drift offered by the differential configuration is maintained and die area is reduced by approximately 25%.

The foregoing description of the present invention has been provided for the purposes of illustration and description. It is not intended to be exhaustive or to limit the invention to the precise forms disclosed. Many modifications and variations will be apparent to the practitioner skilled in the art. Particularly, it will be evident that the above-described features of detecting and ranking images with numerical ranks in order of usefulness based on vignette score can be incorporated into other types of software applications beyond those described. The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalents.

What is claimed is:

1. A circuit to amplify an electrical signal comprising:
    a photo-detector to provide an input signal;
    a first amplifier to receive an input signal from the photo-detector and to amplify the input signal to form an output signal, the first amplifier comprising an active input to receive the input signal and a non-active input; and
    a second amplifier to force a constant voltage at the active and non-active input of the first amplifier, thereby negating a need for a dummy detector on the non-active input of the first amplifier;
wherein the second amplifier maintains an input common mode voltage at an approximately constant level.

2. The circuit of claim 1, wherein the photo-detector comprises a photo diode.

3. A circuit to amplify an electrical signal comprising:
a photo-detector to provide an input signal;
a first amplifier to receive an input signal from the photo-detector and to amplify the input signal to form an output signal, the first amplifier comprising an active input to receive the input signal and a non-active input; and
a second amplifier to force a constant voltage at the active and non-active input of the first amplifier, thereby negating a need for a dummy detector on the non-active input of the first amplifier;
further comprising a reference voltage, V reference, to provide a reference voltage to a non-inverting input of the second amplifier.

4. The circuit of claim 3, wherein the second amplifier senses input common mode voltage of the first amplifier to determine an output signal to force a constant voltage at the active and non-active inputs of the first amplifier.

5. A circuit to amplify an electrical signal comprising:
a photo-detector to provide an input signal;
a first amplifier to receive an input signal from the photo-detector and to amplify the input signal to form an output signal, the first amplifier comprising an active input to receive the input signal and a non-active input; and
a second amplifier to force a constant voltage at the active and non-active input of the first amplifier, thereby negating a need for a dummy detector on the non-active input of the first amplifier;
wherein the first amplifier is a transimpedance amplifier.

6. The circuit of claim 1, wherein the output of the first amplifier is used in a laser-based device.

7. The circuit of claim 6, wherein the laser-based device is a compact disc (CD) drive.

8. The circuit of claim 6, wherein the laser-based device is a digital versatile disc (DVD) drive.

9. The circuit of claim 3, wherein the photo-detector comprises a photo diode.

10. The circuit of claim 5, wherein the photo-detector comprises a photo diode.

11. The circuit of claim 3, wherein the output of the first amplifier is used in a laser-based device.

12. The circuit of claim 5, wherein the output of the first amplifier is used in a laser-based device.

13. a circuit comprising:
a photo-detector;
a transimpedance amplifier operably connected to the photo-detector; and
a second amplifier having a first input being the input common mode voltage of the transimpedance amplifier and a second input being a reference voltage, the output of the second amplifier providing feedback to the transimpedance amplifier.

14. The circuit of claim 12, wherein the second amplifier drives the input common mode voltage of the transimpedance amplifier to an approximately constant level.

15. The circuit of claim 12, wherein the output of the first amplifier is used in a laser-based device.

16. The circuit of claim 15, wherein the laser-based device is a compact disc (CD) drive.

17. The circuit of claim 15, wherein the laser-based device is a digital versatile disc (DVD) drive.

* * * * *

UNITED STATES PATENT AND TRADEMARK OFFICE
CERTIFICATE OF CORRECTION

PATENT NO. : 7,411,460 B2
APPLICATION NO. : 11/372793
DATED : August 12, 2008
INVENTOR(S) : Richard W. Randlett It is certified that error appears in the above-identified patent and that said Letters Patent is hereby corrected as shown below:

Claim 14, column 4, line 1: delete "12" and insert --13--.

Claim 15, column 4, line 1: delete "12" and insert --13--.

Signed and Sealed this

Ninth Day of February, 2010

David J. Kappos
*Director of the United States Patent and Trademark Office*

UNITED STATES PATENT AND TRADEMARK OFFICE
CERTIFICATE OF CORRECTION

PATENT NO.         : 7,411,460 B2                                              Page 1 of 1
APPLICATION NO. : 11/372793
DATED              : August 12, 2008
INVENTOR(S)      : Richard W. Randlett It is certified that error appears in the above-identified patent and that said Letters Patent is hereby corrected as shown below:

Claim 14, column 4, line 22: delete "12" and insert --13--.

Claim 15, column 4, line 25: delete "12" and insert --13--.

This certificate supersedes the Certificate of Correction issued February 9, 2010.

Signed and Sealed this

Ninth Day of March, 2010

David J. Kappos
*Director of the United States Patent and Trademark Office*